(12) United States Patent
Choi (10) Patent No.: US 11,359,064 B2
(45) Date of Patent: Jun. 14, 2022

(54) COMPOSITION FOR PRODUCING GRAPHITE-POLYMER COMPOSITE AND GRAPHITE-POLYMER COMPOSITE PRODUCED THERETHROUGH

(71) Applicant: AMOGREENTECH CO., LTD., Gyeonggi-do (KR)

(72) Inventor: Seung Jin Choi, Seoul (KR)

(73) Assignee: AMOGREENTECH CO., LTD., Gyeonggi-do (KR)

( * ) Notice: Subject to any disclaimer, the term of this patent is extended or adjusted under 35 U.S.C. 154(b) by 160 days.

(21) Appl. No.: 16/764,329

(22) PCT Filed: Nov. 15, 2018

(86) PCT No.: PCT/KR2018/013992
§ 371 (c)(1),
(2) Date: May 14, 2020

(87) PCT Pub. No.: WO2019/098701
PCT Pub. Date: May 23, 2019

(65) Prior Publication Data
US 2020/0283618 A1 Sep. 10, 2020

(30) Foreign Application Priority Data
Nov. 15, 2017 (KR) ........................ 10-2017-0152141

(51) Int. Cl.
| C08L 57/00 | (2006.01) |
| C08J 7/046 | (2020.01) |
| C08L 87/00 | (2006.01) |
| C08K 3/04 | (2006.01) |
| C08K 3/013 | (2018.01) |

(52) U.S. Cl.
CPC ............... *C08J 7/046* (2020.01); *C08L 57/00* (2013.01); *C08L 87/00* (2013.01); *C08K 3/013* (2018.01); *C08K 3/042* (2017.05); *C08K 2201/011* (2013.01)

(58) Field of Classification Search
CPC ...... C08J 7/046; C08J 3/22; C08J 7/06; C08L 57/00; C08L 87/00; C08K 3/013; C08K 2201/011; C08K 3/38; C08K 3/01; C08K 2003/385; C08K 2201/003; C08K 3/04; C08K 9/04; C08K 9/08; C08K 3/22; H05K 7/20
USPC ...................................................... 523/200
See application file for complete search history.

(56) References Cited

U.S. PATENT DOCUMENTS

| 6,492,183 | B1 | 12/2002 | Perman et al. |
| 7,504,550 | B2 | 3/2009 | Tippey et al. |
| 7,951,425 | B2 | 5/2011 | Demir et al. |
| 2008/0153959 | A1 | 6/2008 | Charati |
| 2010/0096317 | A1 | 4/2010 | Morita et al. |
| 2010/0129628 | A1 | 5/2010 | Young et al. |
| 2010/0206614 | A1 | 8/2010 | Park et al. |
| 2014/0186561 | A1* | 7/2014 | Bhattacharya .......... B32B 15/20 428/35.9 |
| 2014/0287230 | A1 | 9/2014 | Walls et al. |
| 2014/0335459 | A1 | 11/2014 | Im et al. |
| 2015/0072070 | A1 | 3/2015 | Saijo et al. |
| 2015/0104565 | A1 | 4/2015 | Chen et al. |
| 2015/0257263 | A1 | 9/2015 | Sethumadhavan et al. |
| 2016/0111730 | A1 | 4/2016 | Kim et al. |
| 2016/0136584 | A1 | 5/2016 | Hwang et al. |
| 2016/0159667 | A1 | 6/2016 | Hwang et al. |
| 2016/0229719 | A1 | 8/2016 | Seo et al. |
| 2017/0005504 | A1 | 1/2017 | Rho et al. |
| 2017/0107355 | A1* | 4/2017 | Kim ....................... C08L 23/12 |
| 2020/0137891 | A1 | 4/2020 | Seo et al. |
| 2021/0086136 | A1 | 3/2021 | Jeong et al. |

(Continued)

FOREIGN PATENT DOCUMENTS

| JP | 09-206568 | 8/1997 |
| JP | JP 2002-524243 | 8/2002 |
| JP | 2014-030825 | 2/2014 |
| JP | 2014201676 A | 10/2014 |
| JP | 2015-088537 | 5/2015 |
| KR | 10-0871440 | 12/2008 |
| KR | 10-2009-0058513 | 6/2009 |
| KR | 10-2010-0023646 | 3/2010 |
| KR | 10-2010-0070041 | 6/2010 |
| KR | 10-2014-0015890 | 2/2014 |
| KR | 101387086 B1 | 4/2014 |
| KR | 10-2014-0128528 | 11/2014 |
| KR | 10-2015-0040692 | 4/2015 |
| KR | 101545430 B1 | 8/2015 |

(Continued)

*Primary Examiner* — Hannah J Pak
(74) *Attorney, Agent, or Firm* — Morrison & Foerster LLP (57) ABSTRACT

Provided is a composition for producing a graphite-polymer composite. A composition for producing a graphite-polymer composite according to an embodiment of the present invention is prepared by comprising: a heat radiation filler comprising a non-insulating filler and an insulating filler, the non-insulating filler comprising a graphite composite including nanoparticles combined to a surface of graphite and a catechol amine layer; and a matrix forming component comprising a thermoplastic polymer compound. According to the present invention, the composition leads to an improvement in insulation property of a heat radiation member and a minimization in deterioration of heat radiation performance of the heat radiation member, so that the utilization of the composition can be improved in industries requiring both heat radiation characteristics and heat insulation performance. In addition, the composition is combined with a base material, and thus is easily modified through injection/extrusion or the like at the time of molding and can be modified into various shapes. The composite produced according to the present invention expresses excellent heat radiation performance, secures excellent mechanical strength, and has excellent lightweightness and excellent economic feasibility, and thus can be widely applied to various technical fields requiring heat radiation.

13 Claims, 3 Drawing Sheets

(56) References Cited

U.S. PATENT DOCUMENTS

2021/0188648 A1\* 6/2021 Choi .................. C08L 23/16

FOREIGN PATENT DOCUMENTS

| KR | 20150110058 A | 10/2015 |
| KR | 20160031103 A | 3/2016 |
| KR | 20160042299 A | 4/2016 |
| KR | 10-2016-0126893 | 11/2016 |
| KR | 10-2017-0023394 | 3/2017 |
| KR | 10-2017-0135768 | 12/2017 |
| KR | 10-2018-0018932 | 2/2018 |
| KR | 10-2018-0018934 | 2/2018 |
| KR | 10-2018-0069340 | 6/2018 |
| KR | 10-2018-0069350 | 6/2018 |
| WO | WO 2000/015331 | 3/2000 |
| WO | WO 2015/053443 | 4/2015 |
| WO | WO 2015/108247 | 7/2015 |

\* cited by examiner

COMPOSITION FOR PRODUCING GRAPHITE-POLYMER COMPOSITE AND GRAPHITE-POLYMER COMPOSITE PRODUCED THERETHROUGH

CROSS REFERENCE TO RELATED APPLICATIONS

This application is a National Stage application under 35 U.S.C. § 371 of International Application No. PCT/KR2018/013992, filed internationally on Nov. 15, 2018, which claims priority to Korean Patent Application No. 10-2017-0152141, filed Nov. 15, 2017, the contents of which are incorporated herein by reference in their entirety.

TECHNICAL FIELD

The present invention relates to a composition for producing a graphite-polymer composite, and more particularly, to a composition for producing a graphite-polymer composite which allows electrical insulation properties as well as heat radiation performance to be improved, and a graphite-polymer composite produced using the same.

BACKGROUND ART

Heat build-up in electronic parts, electric lights, converter housings and other devices that generate unwanted heat can greatly limit product lifetime and reduce operating efficiency. Metals, which are excellent heat conductors, have traditionally been used for heat management devices such as heat sinks and heat exchangers. However, there is a problem that the metal portions are heavy and have high production costs.

Therefore, in recent years, heat radiation members manufactured using injection-moldable or extrudable polymer resins have been proposed, and since such heat radiation members have advantages such as a light weight and low cost attributed to the intrinsic material properties of the polymer resins, much research thereon has been continuously conducted.

Such heat radiation members contain heat radiation fillers provided to realize desired heat radiation properties. However, the heat radiation fillers are inevitably dissimilar to polymer resins which inherently are materials with low thermal conductivity, and this causes a problem in terms of compatibility between the dissimilar materials. For example, although ideally, it may be advantageous in terms of heat radiation performance that the functional filler is uniformly dispersed in the polymer resin, in practice, it is more likely that the functional filler is dispersed in such a way that the functional filler is concentrated at specific locations in the polymer resin, causing dispersibility problems such as the occurrence of cracking or cutting at the specific locations densely packed with the functional filler, leading to remarkable degradation of the heat radiation performance.

Meanwhile, in order to be used in the electronics industry, automotive industry, and electrical devices and components industry, the heat radiation members are required to have an electrical insulation characteristic of not allowing electricity to flow. That is, as electronic parts, automotive parts, and electrical devices and components become highly integrated and miniaturized so that the distances between electronic components are reduced, there is a higher possibility of defects occurring due to the electrical interference between the components, and in this case, electrical conductivity which refers to the ability to allow free electrons present inside a material to move and thereby allow electricity to flow to an external conductor may cause malfunction of electronic products, degradation of lifetime and performance, and the like. However, since heat conductivity, which has the greatest influence on the heat radiation performance of the heat radiation member, and the above-described electrical conductivity occur through the movement of free electrons and have a proportional relationship with each other in the same material at the same temperature, as the heat radiation performance of the heat radiation member is improved, electrical conductivity is also improved, resulting in degradation of electrical insulation properties.

Accordingly, various studies on heat radiation materials that allow the heat radiation performance of a heat radiation member to be improved by improving thermal conductivity while minimizing electrical conductivity, which is in a proportional relationship with thermal conductivity, have been conducted, and recently, in order to supplement insulation properties of the heat radiation materials, techniques related to organic or organic/inorganic composite-type heat radiation members have been proposed. However, since organic or organic/inorganic composite-type heat radiation materials exhibit poor heat radiation performance due to having low thermal conductivity and there is a limitation in processing the same at a high temperature exceeding 300° C., there is a difficulty in applying the same to various industries. In addition, in the case of conventional heat radiation members which are implemented in the forms of films and pads, there is an inconvenience of having to attach the same to conductive objects, and since the heat radiation members are attached to the conductive objects and thus heat is transferred indirectly, there may be a risk that heat radiation performance is degraded, and the heat radiation members are therefore not advantageous for the miniaturization and downsizing of electronic parts, automotive parts, and electrical devices and components.

Accordingly, there is an urgent need for research to improve the utilization of the heat radiation members in various industries by not only preventing degradation of mechanical properties but also improving electrical insulation properties of the heat radiation members and minimizing degradation of their heat radiation performance at the same time to fully utilize the excellent thermal conductivity of graphite.

DISCLOSURE

Technical Problem

The present invention is directed to providing a composition for producing a graphite-polymer composite, which is suitable for producing a graphite-polymer composite that improves electrical insulation properties of a heat radiation member and minimizes degradation of heat radiation performance at the same time and thus has improved utilization in industries requiring both heat radiation characteristics and insulation characteristics.

In addition, the present invention is directed to providing a composition for producing a graphite-polymer composite, which is moldable by various molding methods such as injection molding or extrusion molding and is easily molded into a molded body of various shapes.

Furthermore, the present invention is directed to providing, through the above-described composition for producing a graphite-polymer composite, a graphite composite which is guaranteed to have excellent mechanical strength while exhibiting excellent heat radiation performance, has excellent lightweight qualities and excellent economic efficiency, and is also implemented in various shapes.

Technical Solution

One aspect of the present invention provides a composition for producing a graphite-polymer composite, which includes: a heat radiation filler including a non-insulating filler and an insulating filler, wherein the non-insulating filler includes a graphite composite including nanoparticles bonded to a graphite surface and a catecholamine layer; and a matrix-forming component including a thermoplastic polymer compound.

According to one embodiment of the present invention, the amount of the heat radiation filler may be in the range of 70 to 230 parts by weight relative to 100 parts by weight of the matrix-forming component.

In addition, the amount of the insulating filler may be in the range of 70 to 95% by weight of the total heat radiation filler.

In addition, the insulating filler may include one or more selected from the group consisting of magnesium oxide, titanium dioxide, aluminum nitride, silicon nitride, boron nitride, aluminum oxide, silica, zinc oxide, barium titanate, strontium titanate, beryllium oxide, manganese oxide, talc, silicon carbide, and silicon dioxide.

In addition, the average particle diameter of the insulating filler may be in the range of 10 nm to 600 µm.

In addition, the catecholamine layer may be provided on at least a surface of the nanoparticles.

In addition, the graphite composite may further include a polymer layer at least covering the catecholamine layer.

In addition, the average particle diameter of the graphite composite may be in the range of 50 to 600 µm.

In addition, the thermoplastic polymer compound may be a compound selected from the group consisting of polyamide, polyester, polyketone, a liquid crystal polymer, a polyolefin, polyphenylene sulfide (PPS), polyether ether ketone (PEEK), polyphenylene oxide (PPO), polyethersulfone (PES), polyetherimide (PEI), and polyimide, or a mixture or copolymer of two or more thereof.

In addition, the heat radiation filler may include a graphite composite which includes nanoparticles bonded to a graphite surface and a catecholamine layer.

Another aspect of the present invention provides a masterbatch for producing a graphite-polymer composite, which is prepared by molding the above-described composition for producing a graphite-polymer composite.

Still another aspect of the present invention provides a graphite-polymer composite which includes: a heat radiation filler including a non-insulating filler and an insulating filler, wherein the non-insulating filler includes a graphite composite including nanoparticles bonded to a graphite surface and a catecholamine layer; and a polymer matrix prepared by molding a thermoplastic polymer compound and including the heat radiation filler dispersed therein.

According to one embodiment of the present invention, a protective coating layer may be further provided on an outer surface of the polymer matrix.

In addition, a metal core layer may be further provided inside the polymer matrix.

In addition, the metal core layer may be one type of metal selected from the group consisting of aluminum, magnesium, iron, titanium, and copper, or an alloy containing at least one type of metal thereamong.

Advantageous Effects

According to the present invention, it is possible to improve the insulation properties of a heat radiation member and minimize degradation of heat radiation performance at the same time and thereby improve the utilization of the heat radiation member in industries requiring both heat radiation characteristics and insulation characteristics. In addition, the composition of the present invention is combined with a base material, and thus can be easily molded through injection molding, extrusion molding or the like, and can also be molded into various shapes. The composite implemented thereby is guaranteed to have excellent mechanical strength while exhibiting excellent heat radiation performance and has excellent lightweight qualities and excellent economic efficiency, and thus can be widely applied to various technical fields requiring heat radiation.

DESCRIPTION OF DRAWINGS

FIG. 1 illustrates a graphite composite according to one embodiment of the present invention, wherein

FIG. 3 illustrates a graphite composite according to another embodiment of the present invention, wherein

BEST MODE

Hereinafter, exemplary embodiments of the present invention will be described in detail with reference to the accompanying drawings so that those skilled in the art to which the present invention pertains can easily carry out the embodiments. The present invention may be implemented in various different forms and is not limited to the embodiments described herein. In the drawings, parts not related to descriptions are omitted so that the present invention can be clearly described, and the same reference numerals are assigned to the same or similar elements throughout the specification.

One aspect of the present invention provides a composition for producing a graphite-polymer composite, which includes: a heat radiation filler including a non-insulating filler and an insulating filler, wherein the non-insulating filler includes a graphite composite including nanoparticles bonded to a graphite surface and a catecholamine layer; and a matrix-forming component including a thermoplastic polymer compound.

First, the heat radiation filler will be described.

Figure 1A:
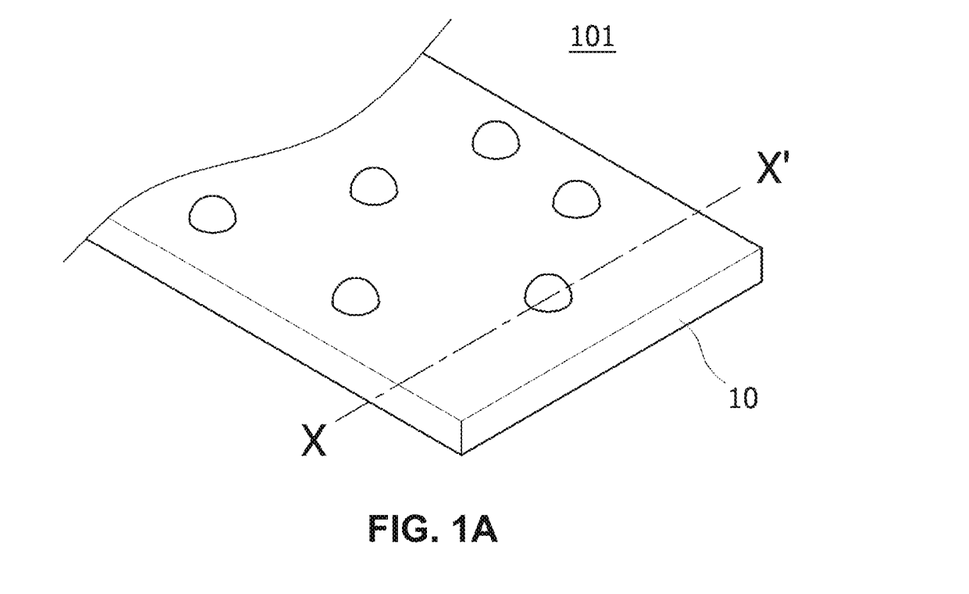
FIG. 1A is a perspective view of the graphite composite.
Figure 1B:
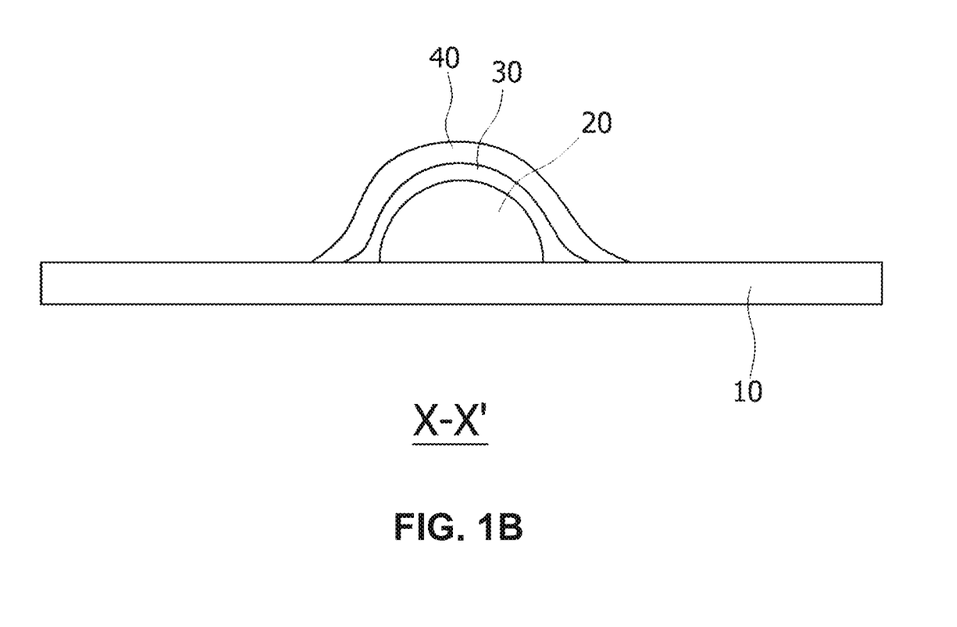
FIG. 1B is a cross-sectional view along the line X-X' in FIG. 1A.

As shown in FIG. 3, the heat radiation filler 100 includes a non-insulating filler 101 and an insulating filler 102. As illustrated in FIGS. 1A and 1B, the non-insulating filler 101 may include a graphite composite which includes nanoparticles 20 bonded to a surface of graphite 10 and a catecholamine layer 30, and the graphite composite may further include a polymer layer 40.

The graphite 10 is a mineral formed of superimposed layers of planar macromolecules in which six-membered rings of carbon atoms are infinitely connected in a plane. The graphite 10 may be a type of graphite known in the art, and specifically, it may be artificial graphite or any one type of natural graphite among crystalline graphite, highly crystalline graphite, and amorphous graphite. For example, when the graphite 10 is natural graphite, it may be expanded graphite obtained by expanding crystalline graphite. The artificial graphite may be manufactured through a known method. For example, single-crystal graphite may be manufactured by preparing a thermosetting resin such as polyimide into a film shape having a thickness of 25 μm or less and then graphitizing the resultant at a high temperature of 2,500° C. or more, or highly-oriented graphite may be manufactured through a chemical vapor deposition (CVD) method by thermally decomposing a hydrocarbon such as methane at high temperatures.

In addition, the graphite 10 may have an irregular shape or a known shape such as a spherical shape, a plate shape, or a needle shape, and has, for example, a plate shape. In addition, the average particle diameter of the graphite 10 may be in the range of 50 to 600 μm and is, for example, 300 μm. The graphite 10 may be high-purity graphite having a purity of 99% or more and thus may be advantageous for manifesting more improved properties.

Next, the nanoparticles 20 bonded to a surface of the above-described graphite 10 function to mediate the provision of the catecholamine layer 30 to be described below on the graphite 10. Specifically, since the surface of the above-described graphite 10 is hardly provided with a functional group or the like capable of mediating a chemical reaction, it is not easy to provide the catecholamine layer 30, which is capable of improving dispersibility of the graphite 10 in a dissimilar material, on the surface of the graphite 10, and therefore, even if the graphite is treated with catecholamine, the amount of catecholamine actually remaining on the graphite is very small. In addition, even if the surface of the graphite is modified so that a functional group is provided thereto to solve the above issue, there is a limit to increasing the amount of catecholamine provided on the modified surface of the graphite. However, in the case of graphite having nanoparticles on a surface thereof, since catecholamine is easily bonded to a surface of the nanoparticles, there is an advantage that a desired amount of catecholamine can be introduced onto the graphite.

The nanoparticle 20 may be a non-insulating nanoparticle. The nanoparticle 20 may be a metal or non-metallic material that is present as a solid at room temperature, and as a non-limiting example, the nanoparticle 20 may be selected from among the alkali metals, the alkaline earth metals, the lanthanides, the actinides, the transition metals, the post-transition metals, the metalloids and the like of the periodic table. For example, the nanoparticle may be Ni, Si, Ti, Cr, Mn, Fe, Co, Cu, Sn, In, Pt, Au, Mg, or a combination thereof and is preferably Cu, Ni, or Si.

In addition, the average particle diameter of the nanoparticle 20 may be in the range of 10 to 500 nm and preferably 10 to 100 nm.

In addition, the nanoparticle 20 is preferably in a crystallized particle state and may be provided to occupy 10 to 70% and more preferably 30 to 70% of the total surface area of the individual graphite 10. In addition, the nanoparticle 20 may be provided in an amount of 5 to 70% and preferably 20 to 60% by weight relative to the total weight of the non-insulating filler 101 containing the graphite composite. In this case, the nanoparticle 20 may form a chemical bond with the graphite 10 and thereby attain stronger bonding.

Next, the catecholamine layer 30 may be provided on at least a surface of the above-described nanoparticle 20 and may thereby enable the graphite composite to have excellent flowability and dispersity in the polymer compound to be described below, which is dissimilar to the graphite composite, and to have improved bonding properties at an interface with the polymer compound. In addition, since the catecholamine layer 30 not only has an intrinsic reducing power but also has a catechol functional group on its surface that forms a covalent bond with an amine functional group through a Michael addition reaction, secondary surface modification is achievable using the catecholamine layer as a bonding material. For example, the catecholamine layer may serve as a binding material capable of introducing the polymer layer 40 onto the graphite to improve dispersibility of the graphite composite in the polymer compound.

Catecholamine which form the catecholamine layer 30 refers to a single molecule having a hydroxyl group (—OH) as an ortho group of a benzene ring and various alkylamines as para groups. Non-limiting examples of various derivatives of such a compound include dopamine, dopamine quinone, epinephrine, alpha-methyldopamine, norepinephrine, alpha-methyldopa, droxidopa, indolamine, serotonin, 5-hydroxydopamine, and the like, and for example, the catecholamine layer 30 may be a dopamine layer. Dopamine is a single-molecule material which has a molecular weight of 153 Da and has catechol and an amine group. For example, when a material whose surface is to be modified is placed in an aqueous solution having a basic pH condition (about pH 8.5) and containing dopamine represented by the following Chemical Formula 1 and is taken out after a predetermined time, the oxidation of catechol may form a polydopamine (pDA) coating layer on a surface of the treated material.

[Chemical Formula 1]

In Chemical Formula 1, at least one of $R_1$, $R_2$, $R_3$, $R_4$, and $R_5$ is independently one selected from the group consisting of a thiol, a primary amine, a secondary amine, a nitrile, an aldehyde, an imidazole, an azide, a halide, polyhexamethylene dithiocarbonate, hydroxyl, a carboxylic acid, a carboxylic ester, and a carboxamide, and the remainder may be hydrogen.

In addition, the thickness of the catecholamine layer 30 may be in the range of 5 to 100 nm, but the present invention is not limited thereto.

Meanwhile, the catecholamine layer 30 may be further coated with a polymer layer 40, and as the compatibility with a polymer compound forming a composite material is increased by the polymer layer 40, more improved fluidity, dispersibility and a more improved interfacial bonding property may be exhibited. The polymer layer 40 may be implemented using a thermosetting polymer compound or a thermoplastic polymer compound, and specific types of the thermosetting polymer compound and the thermoplastic polymer compound may be known. As a non-limiting example, the thermosetting polymer compound may be a compound selected from the group consisting of an epoxy-based resin, a urethane-based resin, an ester-based resin, and a polyimide-based resin, or a mixture or copolymer of two or more thereof. The thermoplastic polymer compound may be a compound selected from the group consisting of polyamide, polyester, polyketone, a liquid crystal polymer, a polyolefin, polyphenylene sulfide (PPS), polyether ether ketone (PEEK), polyphenylene oxide (PPO), polyethersulfone (PES), polyetherimide (PEI), and polyimide, or a mixture or copolymer of two or more thereof. Alternatively, the polymer layer may be an elastic rubber body including natural rubber and/or synthetic rubber or a similar material thereof.

In addition, the average particle diameter of the graphite composite may be in the range of 50 to 600 µm and is, for example, 300 µm. When the above average particle diameter range is satisfied, more improved properties can be exhibited.

Meanwhile, the non-insulating filler 101 may further include a known non-insulating filler in addition to the above-described graphite composite. For example, a carbon-based filler such as carbon black, graphite, or carbon nanotubes and/or a metal-based filler such as copper, silver, nickel, gold, platinum, or iron may be additionally included. In this case, since the amount, particle diameter, shape, and the like of the additional non-insulating filler may be suitably changed in consideration of the amount of the insulating filler to be described below and the heat radiation and insulation characteristics to be realized, they are not particularly limited.

Next, the insulating filler 102 included in the heat radiation filler 100 will be described.

In general, the above-described graphite composite is manufactured through firing at high temperatures and thus has superior properties compared to ordinary carbon, such as excellent heat resistance and excellent elasticity. In particular, the thermal conductivity of the graphite composite (500 W/m·K) is higher than that of existing silver (400 W/m·K), copper (390 W/m·K), and aluminum (230 W/m·K), and due to the structural characteristics of graphite, heat transfer in the transverse direction is also made possible in addition to the heat transfer in the longitudinal (vertical) direction which is usually observed in heat radiation members, and therefore, the graphite composite has excellent heat radiation characteristics. Besides, since the graphite composite is advantageous in terms of weight reduction due to the lightweight qualities inherent in graphite and therefore can cope with the recent trend toward thin, ultra-thin, and lightweight electronic products, there have been continued attempts to use the graphite composite as a heat radiation filler.

However, when a heat radiation filler containing only the graphite composite is provided in a heat radiation member of an electronic device, as the electronic device becomes highly integrated so that the distances between adjacent electronic components are reduced, there is a higher possibility of defects due to the occurrence of electrical short circuits between the electronic components. Because of this, since defects such as malfunction of electronic devices and performance degradation may occur, techniques for electrically insulating electronic components is essential, and furthermore, there is an urgent need for research on a heat radiation member that has improved utilization in an industrial field requiring both heat radiation characteristics and insulation characteristics in one electronic device to prevent performance degradation caused by heat generation and achieve electrical insulation between circuit parts provided in the electronic device.

Therefore, in the present invention, the heat radiation filler 100 includes the insulating filler 102. By being uniformly dispersed in a polymer compound together with the non-insulating filler 101 during molding of the polymer compound, the insulating filler 102 serves to improve the insulating properties of a graphite-polymer composite made of the composition for producing a graphite-polymer composite.

The shape and size of the insulating filler 102 are not limited, and the structure of the insulating filler 102 may be porous or non-porous and may be suitably designed according to purpose, and thus is not particularly limited in the present invention. For example, the insulating filler 102 may include one or more selected from the group consisting of magnesium oxide, titanium dioxide, aluminum nitride, silicon nitride, boron nitride, aluminum oxide, silica, zinc oxide, barium titanate, strontium titanate, beryllium oxide, manganese oxide, talc, silicon carbide, and silicon dioxide.

In addition, the usage amount of the insulating filler 102 may be in the range of 70 to 95% and preferably 80 to 90% by weight of the total heat radiation filler 100. When the usage amount of the insulating filler 102 is less than 70% by weight of the total heat radiation filler 100, since the content of the insulating filler 102 is too low, desired insulation performance may not be exhibited. On the other hand, when the amount of the insulating filler 102 is more than 95% by weight of the total heat radiation filler 100, excellent insulation properties may be exhibited, but the heat radiation performance may be degraded, and furthermore, the uniform dispersion of the insulating filler 102 in the polymer matrix may be hindered, and unreacted materials may be eluted and remain in the form of impurities.

In addition, the average particle diameter of the insulating filler 102 may be in the range of 10 nm to 600 µm and preferably 10 to 500 µm. When the average particle diameter of the insulating filler 102 exceeds 600 µm, since the uniform dispersion of the insulating filler in the polymer matrix is hindered, the uniformity of the insulating filler mixed with the polymer compound may be lowered, and as some of the filler may protrude to the surface, surface properties may be degraded, and the desired level of mechanical strength may not be attained. In addition, when the average particle diameter of the insulating filler 102 is less than 10 nm, there is a risk that the product unit price may increase, and when the insulating filler is mixed with the polymer compound, an increased amount of the insulating filler 102 may come to the surface, causing a problem of degradation in heat radiation performance and insulation performance. In addition, since phase separation may occur, the uniformity of heat radiation performance and insulation performance may be lowered, and since a large number of spaces are formed between particles, heat radiation performance and/or insulation performance may be degraded.

In addition, as illustrated in FIGS. 1A and 1B, the insulating filler 102 may include a graphite composite which includes nanoparticles 20 bonded to a surface of graphite 10 and a catecholamine layer 30 and which may further include a polymer layer 40.

Here, the nanoparticle 20 is an insulating nanoparticle and may include one or more selected from the group consisting of magnesium oxide, titanium dioxide, aluminum nitride, silicon nitride, boron nitride, aluminum oxide, silica, zinc oxide, barium titanate, strontium titanate, beryllium oxide, manganese oxide, and talc.

Meanwhile, the nanoparticle 20, the catecholamine layer 30, and the polymer layer 40 have been described in the foregoing description of the non-insulating filler 101, and therefore, detailed descriptions thereof will be omitted.

As described above, each of the non-insulating filler 101 and the insulating filler 102 may include a graphite composite, and the graphite composite may be prepared through processes including preparing a graphite-nanoparticle conjugate in which nanoparticles are formed on a surface of graphite and forming a catecholamine layer on the graphite-nanoparticle conjugate, wherein an additional process of forming a polymer layer may be carried out after the catecholamine layer is formed.

In the preparation of the graphite-nanoparticle conjugate in which nanoparticles are formed on a surface of graphite according to one embodiment of the present invention, any method may be employed as long as it is a known method of forming nanoparticles on a surface of graphite, and non-limiting examples of such a method that may be employed when non-insulating nanoparticles are included include an inert gas condensation (IGC) method, a chemical vapor condensation (CVC) method, a metal salt spray drying method and the like, which are existing gas-phase synthesis techniques for manufacturing metal-based nanopowders. However, among the above techniques, the IGC process may be capable of manufacturing a high-purity, ultra-fine metal nanopowder, but requires much energy and has limitations in industrial applications due to having a very low production rate, and the CVC process may be a somewhat improved process in terms of energy and production speed compared to the IGC process but may be uneconomical because the price of a precursor, which is a raw material, is very high. Also, the metal-salt spray drying process may be economical because an inexpensive salt is used as a raw material, but contamination and powder agglomeration in the drying step are unavoidable, and there is a disadvantage from an environmental point of view because harmful by-products are generated.

Therefore, preferably, nanoparticles are formed on graphite using atmospheric-pressure high frequency thermal plasma. Specifically, the formation of nanoparticles may be achieved through the processes of mixing graphite with a nanoparticle-forming powder, injecting a gas into the prepared mixture, vaporizing the nanoparticle-forming material using high frequency thermal plasma, and crystallizing the vaporized nanoparticle-forming material on a surface of the graphite.

First, in the mixing of graphite and a nanoparticle-forming powder, the mixing ratio between the two materials may be variously designed according to purpose.

Subsequently, a gas may be injected into the prepared mixture. Here, the injected gas may be classified into a sheath gas, a central gas, a carrier gas, and the like according to its function, and as such a gas, an inert gas (e.g., argon), hydrogen, nitrogen, or a mixed gas thereof may be used, and argon gas is preferably used. The sheath gas is injected to prevent the vaporized nanoparticles from being deposited on the inner surface of the wall as well as to protect the wall surface from the ultra-high temperature plasma, and an argon gas flow of 30 to 80 LPM (liters per minute) may be used. The central gas is injected to generate a high temperature thermal plasma, and an argon gas flow of 30 to 70 LPM may be used. The carrier gas serves to supply the mixture into a plasma reactor, and an argon gas flow of 5 to 15 LPM may be used.

Subsequently, the nanoparticle-forming material may be vaporized using high frequency thermal plasma. The thermal plasma is an ionized gas generated by a plasma torch that uses a direct current arc or high frequency inductively coupled discharge. The thermal plasma consists of electrons, ions, atoms, and molecules and is a high-speed jet having an ultra-high temperature ranging from several thousand to several tens of thousand kelvin (K) and high reactivity. Therefore, in order to generate high temperature plasma smoothly, the power of 10 to 70 kW is supplied with a power supply device of the plasma device, an arc is formed by electrical energy, and an ultra-high temperature plasma of about 10,000 K is generated by the argon gas used as a thermal plasma-generating gas. Such an ultra-high temperature thermal plasma which is generated using the argon gas as a generating gas while maintaining the power of 10 to 70 kW has an effect of being generated at a higher temperature than a thermal plasma generated by a heat-treatment method or combustion method. Here, in the present invention, a suitable modification of a known radio frequency (RF) thermal plasma method may be used, and an existing thermal plasma treatment apparatus may also be used.

Subsequently, a process of crystallizing the vaporized nanoparticle-forming material on a surface of the graphite may be carried out. In order to crystallize the vaporized nanoparticle-forming material on a surface of the graphite, a quenching gas may be used. In this case, the quenching gas may be used to condense or quench the nanoparticle-forming material to achieve crystallization while suppressing the growth of nanoparticles.

Meanwhile, when the nanoparticles provided in the above-described graphite composite are insulating nanoparticles, any method may be used without limitation as the method of preparing the graphite-nanoparticle conjugate included in the insulating filler 102 and including nanoparticles formed therein as long as it is a known, conventional method of forming nanoparticles on a surface of graphite, and therefore, the method is not particularly limited in the present invention.

Subsequently, a process of forming a catecholamine layer on the graphite-nanoparticle conjugate prepared by the above-described method may be carried out, and specifically, a process of dipping the graphite-nanoparticle conjugate in a weakly basic aqueous solution of dopamine and a process of forming a polydopamine layer on a surface of the graphite-nanoparticle conjugate may be carried out.

First, the method of preparing the weakly basic aqueous dopamine solution is not particularly limited, and the weakly basic aqueous dopamine solution may be prepared by dissolving dopamine in a basic Tris buffer solution (10 mM) having a pH of 8 to 14 and more preferably a basic Tris buffer solution having a pH of 8.5 which is the same basic condition as in the seawater environment. Here, the dopamine concentration of the weakly basic aqueous dopamine solution may be in the range of 0.1 to 5 mg/ml and preferably 2 mg/ml.

When the graphite-nanoparticle conjugate is dipped in the prepared weakly basic aqueous dopamine solution, the dopamine may spontaneously undergo a polymerization reaction under basic, oxidizing conditions to form a catecholamine layer, which is a polydopamine layer, on the graphite-nanoparticle conjugate. In this case, the polydopamine layer may be formed by further using an oxidizing agent, and oxygen gas in the air may be used as an oxidizing agent without any other oxidizing agent, but the present invention is not particularly limited thereto.

Here, the dipping time determines the thickness of the polydopamine layer, and to form a catecholamine layer having a thickness of 5 to 100 nm using an aqueous dopamine solution having a pH of 8 to 14 and a dopamine concentration of 0.1 to 5 mg/ml, it is preferred that the dipping is performed for about 0.5 to 24 hours. Although a dopamine coating layer is hardly formed on pure, plate-like graphite by such a method, thanks to the nanoparticles, a catecholamine layer can be formed on the nanoparticles. Meanwhile, although the dipping method has been illustrated as a method of forming the above-described polymer layer, the present invention is not limited thereto, and a polymer layer may also be formed through a known method such as a blade coating method, a flow coating method, a casting method, a printing method, a transfer method, brushing, or spraying.

Meanwhile, in order to further provide a polymer layer in the graphite composite including a catecholamine layer formed therein, a graphite composite including a polymer layer formed therein may be prepared by mechanically mixing a graphite composite with a solution in which a polymer compound of interest is dissolved or a melt obtained by melting the polymer compound of interest.

Subsequently, a process of mixing the prepared non-insulating filler 101 and an insulating filler 102 may be carried out. The graphite composite may be mixed with an insulating filler by any method known in the art, for example, solution blending.

The solution blending may blend the non-insulating filler 101 and the insulating filler 102 using shear, compression, ultrasonic vibration, or the like to promote homogenization. In one embodiment, the non-insulating filler 101 suspended in a fluid and the insulating filler 102 may be introduced into an ultrasonic sonicator in the form of a mixture.

Meanwhile, the usage amount of the heat radiation filler 100 may be in the range of 70 to 230 parts by weight and preferably 80 to 200 parts by weight relative to 100 parts by weight of the matrix-forming component to be described below. When the usage amount of the heat radiation filler 100 is less than 70 parts by weight relative to 100 parts by weight of the matrix-forming component, insulation performance and/or heat radiation performance may be degraded, and when the usage amount of the heat radiation filler 100 is more than 230 parts by weight relative to 100 parts by weight of the matrix-forming component, mechanical strength may be lowered.

Next, a matrix-forming component including a thermoplastic polymer compound will be described.

The thermoplastic polymer compound provided in the matrix-forming component may include a known thermoplastic polymer compound and may be a material constituting the body of the graphite-polymer composite to be described below. The thermoplastic polymer compound is preferably a compound selected from the group consisting of polyamide, polyester, polyketone, a liquid crystal polymer, a polyolefin, polyphenylene sulfide (PPS), polyether ether ketone (PEEK), polyphenylene oxide (PPO), polyethersulfone (PES), polyetherimide (PEI), and polyimide, or a mixture or copolymer of two or more thereof. The polyamide may be a known polyamide-based compound such as nylon 6, nylon 66, nylon 11, nylon 610, nylon 12, nylon 46, nylon 9T (PA-9T), Qiana, or aramid.

For example, the polyester may be a known polyester-based compound such as polyethylene terephthalate (PET), polytrimethylene terephthalate (PTT), polybutylene terephthalate (PBT), or polycarbonate.

As another example, the polyolefin may be a known polyolefin-based compound such as polyethylene, polypropylene, polystyrene, polyisobutylene, or ethylene vinyl alcohol.

The liquid crystal polymer may be a polymer exhibiting liquid crystallinity in a solution or dissolution state without limitation, and may be a known type, and therefore, the present invention is not particularly limited thereto.

The composition for producing a graphite-polymer composite according to one embodiment of the present invention may be implemented by further including one or more additives selected from the group consisting of an antioxidant, an impact modifier, a flame retardant, a strength modifier, a heat stabilizer, a light stabilizer, a plasticizer, an antistatic agent, a workability-improving agent, a UV absorber, a dispersing agent, and a coupling agent.

The antioxidant prevents the main chain of the thermoplastic polymer compound from being broken due to shearing during extrusion or injection, and is provided for preventing thermal discoloration and the like. As the antioxidant, a known antioxidant may be used without limitation, and non-limiting examples of such an antioxidant include: an organic phosphite such as tris(nonylphenyl) phosphite, tris(2,4-di-t-butylphenyl)phosphite, bis(2,4-di-t-butylphenyl)pentaerythritol diphosphite, distearyl pentaerythritol diphosphite, or a similar material thereof; an alkylated monophenol or polyphenol; an alkylated reaction product of polyphenol having a diene, such as tetrakis [methylene(3,5-di-tert-butyl-4-hydroxyhydrocinnamate)] methane or a similar material thereof; a butylated reaction product of para-cresol or dicyclopentadiene; an alkylated hydroquinone; a hydroxylated thiodiphenyl ether; alkylidene bisphenol; a benzyl compound; an ester of a monohydric or polyhydric alcohol and beta-(3,5-di-tert-butyl-4-hydroxyphenyl)-propionic acid; an ester of a monohydric or polyhydric alcohol and beta-(5-tert-butyl-4-hydroxyl-3-methylphenyl)-propionic acid; an ester of a thioalkyl or thioaryl compound such as distearylthiopropionate, dilaurylthiopropionate, ditridecylthiopropionate, octadecyl-3-(3,5-di-tert-butyl-1-4-hydroxyphenyl)propionate, pentaerythryl-tetrakis[3-(3,5-di-tert-butyl-4-hydroxyphenyl)propionate, or a similar material thereof; an amide of beta-(3,5-di-tert-butyl-4-hydroxyphenyl)-propionic acid or a similar material thereof; and a mixture thereof. The usage amount of the antioxidant may be in the range of 0.01 to 0.5 parts by weight relative to 100 parts by weight of the thermoplastic polymer compound.

As the impact modifier, any known material capable of improving impact resistance by allowing the flexibility of a composite material consisting of graphite and a polymer compound or stress relaxation to be realized may be used without limitation, and for example, one or more materials selected from the group consisting of thermoplastic polyurethane (TPU), a thermoplastic polyolefin (TPO), a maleic acid-grafted EPDM, core/shell structured elastic particles, a rubber-based resin, and a polyamide-based material may be provided as the impact modifier. The thermoplastic polyolefin is a group of materials similar to rubber and may be a linear polyolefin block copolymer having a polyolefin block such as polypropylene or polyethylene and a rubber block or a blend of polypropylene and an ethylene-propylene-diene monomer (EPDM), which is an ethylene-based elastomer, and specifically, since a known thermoplastic polyolefin may be used as the thermoplastic polyolefin, a description of specific types thereof is omitted in the present invention. Likewise, since a known thermoplastic polyurethane may be used as the thermoplastic polyurethane, a description of specific types thereof is omitted. In addition, in one example of the core/shell structured elastic particles, the core is an allyl-based resin, and the shell is a polymer resin which has a functional group capable of reacting to improve the compatibility and bonding strength with the thermoplastic polymer compound.

Examples of the flame retardant include halogenated flame retardants, a like tetrabromo bisphenol A oligomer such as BC58 and BC52, brominated polystyrene or poly (dibromostyrene), brominated epoxy, decabromodiphenylene oxide, pentabromophenyl acrylate monomers, pentabromobenzyl acrylate polymers, ethylene bis (tetrabromophthalimide), bis(pentabromobenzyl)ethane, metal hydroxides such as $Mg(OH)_2$ and $Al(OH)_3$, melamine cyanurate, phosphorus-based FR systems such as red phosphorus, melamine polyphosphate, phosphate esters, metal phosphinate, ammonium polyphosphate, expanded graphite, sodium or potassium perfluorobutane sulfate, sodium or potassium perfluorooctane sulfate, sodium or potassium diphenylsulfone sulfonate, sodium- or potassium-2,4,6-trichlorobenzonate, N-(p-tolylsulfonyl)-p-toluenesulfimide potassium salt, N—(N'-benzylaminocarbonyl)sulfanylimide potassium salt, and mixtures thereof, but the present invention is not limited thereto. The usage amount of the flame retardant may be in the range of 0.1 to 50 parts by weight relative to 100 parts by weight of the thermoplastic polymer compound.

As the strength modifier, any known material capable of improving the strength of a composite material consisting of graphite and a polymer compound may be used without limitation, and as a non-limiting example thereof, one or more materials selected from the group consisting of carbon fiber, glass fiber, glass beads, zirconium oxide, wollastonite, gibbsite, boehmite, magnesium aluminate, dolomite, calcium carbonate, magnesium carbonate, mica, talc, silicon carbide, kaolin, calcium sulfate, barium sulfate, silicon dioxide, ammonium hydroxide, magnesium hydroxide, and aluminum hydroxide may be used as the strength modifier. For example, the strength modifier may be glass fiber. The usage amount of the strength modifier may be in the range of 5 to 35 parts by weight, preferably 15 to 35 parts by weight, and more preferably 25 to 33.3 parts by weight relative to 100 parts by weight of the thermoplastic polymer compound. When the content of the strength modifier is below the above-described range, strength cannot be improved to a desired level, and when the content of the strength modifier exceeds the above-described range, lightweight qualities and a flexural modulus may be degraded.

Meanwhile, when glass fiber is used as the strength modifier, the glass fiber may have a length of 2 to 8 mm, preferably 2 to 7 mm, and most preferably 4 mm and an average fiber diameter of 1 to 30 μm, preferably 3 to 20 μm, and most preferably 10 μm.

In addition, as the heat stabilizer, a known heat stabilizer may be used without limitation, and as a non-limiting example thereof, an organic phosphite such as triphenyl phosphite, tris(2,6-dimethylphenyl)phosphite, tris(mixed mono- and dinonylphenyl)phosphite, or a similar material thereof; a phosphonate such as dimethylbenzene phosphonate or a similar material thereof; a phosphate such as trimethyl phosphate or a similar material thereof; or a mixture thereof may be used. The usage amount of the heat stabilizer may be in the range of 0.01 to 0.5 parts by weight relative to 100 parts by weight of the thermoplastic polymer compound.

In addition, as the light stabilizer, a known light stabilizer may be used without limitation, and as a non-limiting example thereof, a benzotriazole such as 2-(2-hydroxy-5-methylphenyl)benzotriazole, 2-(2-hydroxy-5-tert-octylphenyl)benzotriazole, 2-hydroxy-4-n-octoxy-benzophenone, or a similar material thereof, or a mixture thereof may be used.

The usage amount of the light stabilizer may generally be in the range of 0.1 to 1.0 part by weight relative to 100 parts by weight of the total composition except all fillers.

In addition, as the plasticizer, a known plasticizer may be used without limitation, and as a non-limiting example thereof, a phthalic acid ester such as dioctyl-4,5-epoxy-hexahydrophthalate, tris(octoxycarbonylethyl)isocyanurate, tristearin, epoxidized soybean oil, or a similar material thereof, or a mixture thereof may be used. The usage amount of the plasticizer may be in the range of 0.5 to 3.0 parts by weight relative to 100 parts by weight of the thermoplastic polymer compound.

In addition, as the antistatic agent, a known antistatic agent may be used without limitation. As a non-limiting example thereof, glycerol monostearate, sodium stearyl sulfonate, sodium dodecylbenzenesulfonate, polyether block amide, or a mixture thereof may be used, and such a material is commercially obtainable from, for example, BASF SE (under the trade name Irgastat); Arkema S. A. (under the trade name Pebax); and Sanyo Chemical Industries, Ltd. (under the trade name PELESTAT). The usage amount of the antistatic agent may be in the range of 0.1 to 1.0 part by weight relative to 100 parts by weight of the thermoplastic polymer compound.

In addition, as the workability-improving agent, any known workability-improving agent may be used without limitation, and as a non-limiting example thereof, metal stearate, stearyl stearate, pentaerythritol tetrastearate, beeswax, montan wax, paraffin wax, polyethylene wax, or a similar material thereof, or a mixture thereof may be used. The usage amount of the workability-improving agent may be in the range of 0.1 to 1.0 part by weight relative to 100 parts by weight of the thermoplastic polymer compound.

In addition, as the UV absorber, any known UV absorber may be used without limitation, and as a non-limiting example thereof, hydroxybenzophenone; hydroxybenzotriazole; hydroxybenzotriazine; a cyanoacrylate; an oxanilide; a benzoxazinone; 2-(2H-benzotriazol-2-yl)-4-(1,1,3,3,-tetramethylbutyl)-phenol; 2-hydroxy-4-n-octyloxybenzophenone; 2-[4,6-bis(2,4-dimethylphenyl)-1,3,5-triazin-2-yl]-5-(octyloxy)-phenol; 2,2'-(1,4-phenylene)bis(4H-3,1-benzoxazin-4-one); 1,3-bis[(2-cyano-3,3-diphenylacryloyl)oxy]-2,2-bis[[(2-cyano-3,3-biphenylacryloyl)oxy]methyl] propane; 2,2'-(1,4-phenylene)bis(4H-3,1-benzoxazin-4-one); 1,3-bis[(2-cyano-3,3-diphenylacryloyl)oxy]-2,2-bis[[(2-cyano-3,3-diphenylacryloyl)oxy]methyl] propane; a nano-sized inorganic material such as titanium oxide, cerium oxide, or zinc oxide with a particle diameter of less than 100 nm; or a similar material thereof; or a mixture thereof may be used. The usage amount of the UV absorber may be in the range of 0.01 to 3.0 parts by weight relative to 100 parts by weight of the thermoplastic polymer compound.

In addition, as the dispersing agent and the coupling agent, any known dispersing agent and coupling agent may be used without limitation, and as a non-limiting example of the coupling agent, maleic acid-grafted polypropylene, a silane-based coupling agent, or the like may be used for heat resistance.

Meanwhile, according to one embodiment of the present invention, the above-described composition for producing a graphite-polymer composite is implemented as a masterbatch for producing a graphite composite. For example, the masterbatch may be prepared by melt-extruding the graphite-polymer composite and cutting the resultant into a predetermined size. However, the present invention is not limited to the above-described method, and any known method of manufacturing a masterbatch may be employed without limitation.

Next, the graphite-polymer composite according to one embodiment of the present invention will be described.

Figure 2:
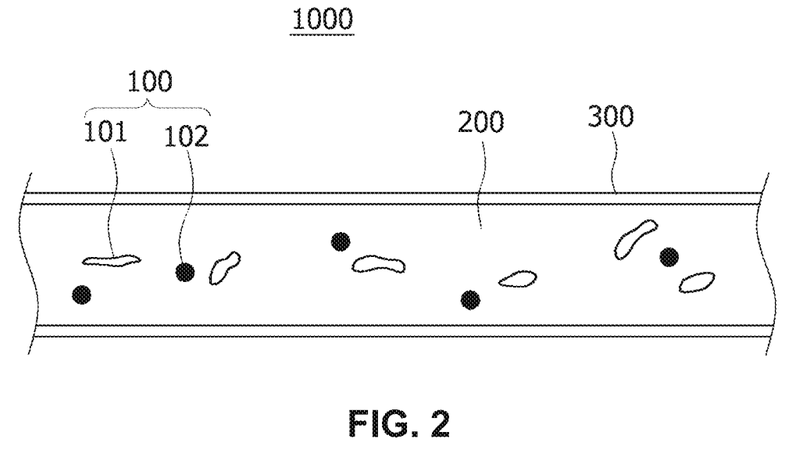
FIG. 2 is a cross-sectional view of a graphite-polymer composite according to one embodiment of the present invention.

As illustrated in FIG. 2, the graphite-polymer composite 1000 is implemented by including: a heat radiation filler 100 including a non-insulating filler 101 and an insulating filler 102, wherein the non-insulating filler 101 includes a graphite composite including nanoparticles bonded to a graphite surface and a catecholamine layer; and a polymer matrix 200 formed by molding a thermoplastic polymer compound and containing the heat radiation filler 100 dispersed therein, wherein on an outer surface of the polymer matrix 200, a protective coating layer 300 may be further provided.

Although the non-insulating filler 101 and the insulating filler 102 are illustrated in FIG. 2 as being dispersed only inside the polymer matrix 200, unlike the illustration in FIG. 2, the fillers may be disposed so as to be exposed on the outer surface.

The non-insulating filler 101 includes the above-described graphite composite, and serves to improve heat radiation performance by being uniformly dispersed inside the polymer matrix 200. In this case, the usage amount of the non-insulating filler 101 may be in the range of 5 to 30% and preferably 10 to 20% by weight of the total heat radiation filler 100. When the usage amount of the non-insulating filler 101 is less than 5% by weight of the total heat radiation filler 100, desired levels of heat radiation and shielding performance may not be realized. On the other hand, when the usage amount of the non-insulating filler 101 is more than 30% by weight of the total heat radiation filler 100, the mechanical strength of the graphite composite may be significantly lowered, moldability such as injection moldability may be lowered, and it may be difficult to realize a complex shape using the graphite composite. Also, although the desired heat radiation characteristics may be attained to some extent, there may be disadvantages in regard to insulation properties which are inversely related to heat radiation performance.

The type, size, shape, and the like of the insulating filler 102 may be appropriately selected according to the mode of application of the heat radiation member of interest. That is, although illustrated as being oval in the drawing, the shape of the insulating filler 102 may vary depending on the type, weight-average molecular weight, polymer type, and the like of the insulating filler 102 used, and since the shape of the insulating filler 102 is schematically illustrated in the drawing because there is a difficulty of accurate measurement with a measuring device, the shape is not limited in the present invention. In addition, the insulating filler 102 may include the above-described graphite composite, and may serve to improve insulation performance by being uniformly dispersed inside the polymer matrix 200.

The polymer matrix 200 is formed of the above-described thermoplastic polymer compound, and since the polymer matrix 200 has been described in detail above, a further description thereof will be omitted.

The protective coating layer 300 may be further provided on an outer surface of the polymer matrix 200. The protective coating layer 300 prevents the separation of the non-insulating filler 101 and the insulating filler 102 located on a surface of the polymer matrix, prevents scratches and the like which may be caused by physical impact applied to the surface, and depending on the material, provides an insulating function and thus may enable application to a field where both insulation and heat radiation are required, such as the field of electronic devices.

The protective coating layer 300 may be implemented using a known thermosetting polymer compound or a thermoplastic polymer compound. The thermosetting polymer compound may be a compound selected from the group consisting of an epoxy-based resin, a urethane-based resin, an ester-based resin, and a polyimide-based resin, or a mixture or copolymer of two or more thereof. In addition, the thermoplastic polymer compound may be a compound selected from the group consisting of polyamide, polyester, polyketone, a liquid crystal polymer, a polyolefin, polyphenylene sulfide (PPS), polyether ether ketone (PEEK), polyphenylene oxide (PPO), polyethersulfone (PES), polyetherimide (PEI), and polyimide, or a mixture or copolymer of two or more thereof, but the present invention is not limited thereto.

The thickness of the protective coating layer 300 may be in the range of 0.1 to 1,000 μm, but the present invention is not limited thereto, and the thickness may be changed according the purpose.

Meanwhile, the protective coating layer 300 may impede the radiation of the conducted heat into the air. Therefore, in order to further improve the heat radiation characteristics and particularly heat radiation in the outside air, the protective coating layer 300 may be a heat radiation coating layer in which a heat radiation filler is further provided. As the heat radiation filler, a known heat radiation filler may be used without limitation, and when insulation is also required, it is preferable to use one or more insulating heat radiation fillers selected from the group consisting of aluminum oxide, boron nitride, talc, magnesium oxide, silicon carbide, and the like.

The type, particle size, content, and the like of the heat radiation filler provided in the protective coating layer 300 may be variously designed according to purpose and thus are not particularly limited in the present invention.

Figure 3A:
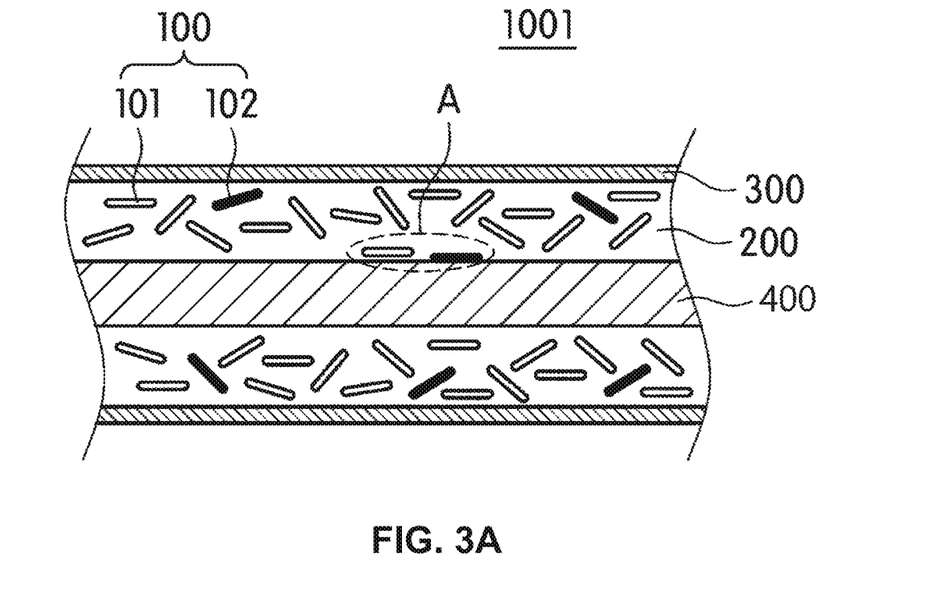
FIG. 3A is a cross-sectional view illustrating a case where the metal core layer forms an interface with the polymer matrix at all surfaces thereof.
Figure 3B:
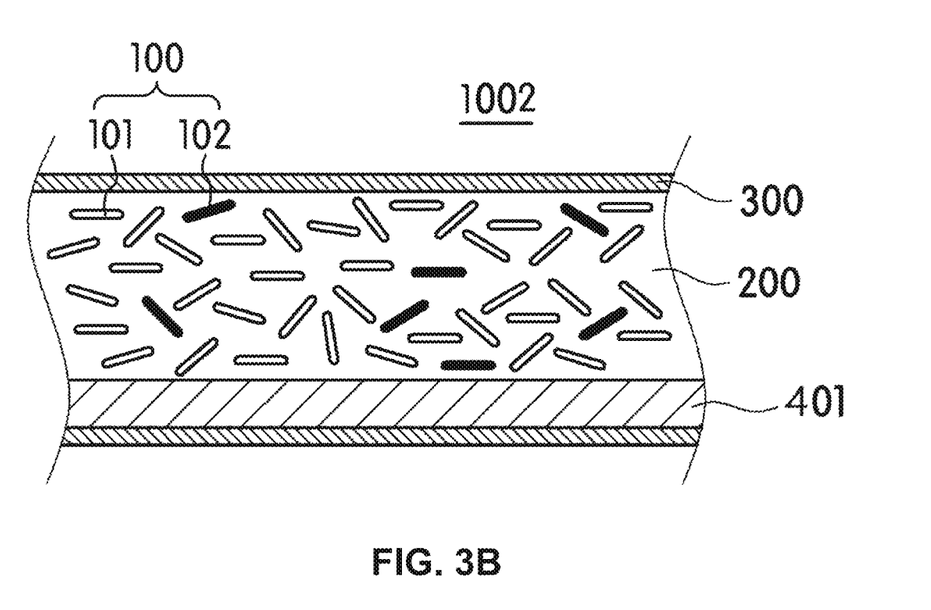
FIG. 3B is a cross-sectional view illustrating a case where the metal core layer forms an interface with the polymer matrix at all surfaces thereof except a bottom surface.

Meanwhile, as illustrated in FIGS. 3A and 3B, the graphite-polymer composite 1001 or 1002 of the present invention may further include a metal core layer 400 or 401 provided in/on the polymer matrix 200.

The metal core layer 400 or 401 allows a certain level of heat radiation performance to be exhibited while ensuring the mechanical strength of the graphite-polymer composite 1001 or 1002.

As the metal core layer 400 or 401, any metal material may be used without limitation as long as it has good compatibility with the polymer matrix 200, has excellent mechanical strength even at a small thickness while being capable of preventing the metal core layer 400 or 401 from being spaced apart from the polymer matrix 200 at the interface, and has heat resistance sufficient to enable injection molding and a certain level of thermal conductivity at the same time. The metal core layer 400 or 401 is preferably a metal selected from the group consisting of aluminum, magnesium, iron, titanium, and copper or an alloy containing at least one thereof.

In addition, the metal core layer 400 or 401 may be provided so that all surfaces thereof are surrounded by the polymer matrix 200 and form an interface with the polymer matrix 200 as in the case of the metal core layer 400 (see FIG. 3A) or that all surfaces thereof except a bottom surface form an interface with the polymer matrix 200 as in the case of the metal core layer 401 (see FIG. 3B), and a specific location of the metal core layer 400 or 401 within the polymer matrix 200 when at least three surfaces of the metal core layer 400 or 401 contact the polymer matrix 200 is not limited in the present invention.

In addition, the thickness of the metal core layer 400 or 401 may be in the range of 0.5 to 90% of the total thickness of the graphite-polymer composite 1001 or 1002. When the thickness of the metal core layer 400 or 401 is less than 0.5% of the total thickness of the graphite-polymer composite 1001 or 1002, it may be difficult to ensure the desired level of mechanical strength, and when the thickness of the metal core layer 400 or 401 is more than 90% of the total thickness of the graphite-polymer composite 1001 or 1002, it may be difficult to realize the desired level of heat radiation performance and particularly radiation characteristics, and moldability into a complex shape may be lowered. In addition, since a thicker metal core layer greatly increases the volume resistance of the graphite-polymer composite, the insulating properties of the graphite-polymer composite may be significantly reduced, making it difficult for the graphite-polymer composite to be used in electronic devices or components requiring insulation characteristics.

In addition, the metal core layer 400 or 401 may have various structures. The metal core layer 400 or 401 may have a shape of a rod with a predetermined aspect ratio or a plate with a predetermined width, a parallel, lattice or honeycomb structure formed by including a plurality of wires or bars spaced at predetermined intervals inside a wire or bar rim having a predetermined shape such as a square or a circle, or a combination thereof.

Modes of the Invention

Hereinafter, the present invention will be described in more detail through the following exemplary embodiments, but the following exemplary embodiments are not intended to limit the scope of the present invention and should be construed as being provided to facilitate understanding of the present invention.

Preparation Example

As a non-insulating filler, a graphite composite was prepared by the following method.

Specifically, a raw material powder was prepared by mixing a plate-shaped expanded graphite having an average particle diameter of 300 μm and a nickel powder at a mixing ratio of 1:19 for 10 minutes. Also, argon gas respectively flowing at 30 LPM and 50 LPM was injected as a central gas and a sheath gas into a high frequency thermal plasma apparatus. Subsequently, after generating a high temperature thermal plasma by applying 17 kW with a plasma torch power source, the degree of vacuity of the apparatus was maintained at 500 Torr before injecting the raw material powder into the apparatus, and then the prepared raw material powder was injected into a high frequency thermal plasma reactor through a spraying nozzle of a plasma generating electrode portion. Inside the high frequency thermal plasma reactor, graphite was allowed to be transferred without being damaged by the heat of plasma, and only the nickel powder was crystallized into nanoparticles through a selective vaporization process and thereby combined with the graphite. The graphite-nickel nanoparticle conjugate obtained as such was separated in a cyclone unit, transferred through a transport pipe, and adsorbed onto a filter of a collector, and the powder adsorbed onto the filter was subjected to a blowback process and then collected in a collection unit.

Subsequently, in order to form a catecholamine layer on the collected conjugate, dopamine was dissolved in a Tris buffer solution (TBS, 100 mM) to a concentration of 2 mM, and 1 L of the solution was mixed with 5 g of the conjugate, and the mixture was stirred for two hours at room temperature and atmospheric pressure. In order to increase the reaction rate between the dopamine and the nickel nanoparticles, sodium periodate was added in an amount of 10% of the weight of dopamine. After stirring was performed for two hours, unreacted materials were removed through filtration, and the resultant was washed twice with DI water and then dried at room temperature, and thereby a graphite composite coated with polydopamine was obtained. In the obtained graphite composite, weight percentages of the graphite, the nanoparticles, and the polydopamine were 94.95%, 5%, and 0.05%, respectively. In addition, the average particle diameter of the nanoparticles confirmed through an SEM photograph was 32 nm.

Example 1

First, a composition for producing a graphite-polymer composite was prepared by mixing polyamide 6 as a thermoplastic polymer compound with a heat radiation filler consisting of 10 wt % of a non-insulating filler and 90 wt % of an insulating filler so that the total amount of the heat radiation filler was 100 parts by weight relative to 100 parts by weight of polyamide 6, wherein the non-insulating filler was the graphite composite prepared according to Preparation Example, and the insulating filler was boron nitride having an average particle diameter of 150 μm. Subsequently, after introducing the composition into a main hopper and a site feeder of a coaxial twin-screw extruder, the composition was melted under an extruder barrel temperature condition of 280° C., prepared into a pellet using a Strand cutting method, and then dried in a hot-air dryer to prepare a masterbatch for producing a graphite-polymer composite.

After the masterbatch was obtained and an aluminum plate having a width of 12 cm, a length of 6 cm, and a thickness of 1.5 mm was provided as a metal support layer, the masterbatch and the metal support layer were subjected to injection molding using a conventional injection-molding device in such a way that the polymer matrix formed from the molten masterbatch and having a thickness of 3 mm surrounded the both surfaces of the metal support layer, and thereby a graphite-polymer composite having a structure as illustrated in FIG. 3A was obtained.

Examples 2 to 12 and Comparative Examples 1 to 2

The graphite-polymer composites as shown in Table 1 to Table 3 were prepared in the same manner as in Example 1 but changes to the amounts of the non-insulating filler and the insulating filler in the heat radiation filler, the total amount of the heat radiation filler, the average particle diameter of the insulating filler, whether or not to include the metal core layer, and the like, were made.

Experimental Example

The following properties of the graphite-polymer composites prepared according to Examples and Comparative Examples were evaluated, and results thereof are shown in Table 1 to Table 3.

1. Measurement of In-Plane Thermal Conductivity

The in-plane thermal conductivity of the graphite-polymer composites prepared according to Examples and Comparative Examples were measured in accordance with ASTM E1461.

2. Measurement of Tensile Strength and Impact Strength

The tensile strength and impact strength of the graphite-polymer composites prepared according to Examples and Comparative Examples were measured in accordance with ASTM D638 and ASTM D256, respectively.

3. Measurement of Surface Resistance and Volume Resistance

The surface resistance and volume resistance of the graphite-polymer composites prepared according to Examples and Comparative Examples were measured in accordance with ASTM D257.

4. Measurement of Dielectric Breakdown Strength and Dielectric Breakdown Voltage The dielectric breakdown strength and dielectric breakdown voltages of the graphite-polymer composites prepared according to Examples and Comparative Examples were measured in accordance with ASTM D149.

TABLE 1

| | Classification | | Example 1 | Example 2 | Example 3 | Example 4 | Example 5 |
|---|---|---|---|---|---|---|---|
| Heat radiation filler | Total content (parts by weight) | | 100 | 100 | 100 | 50 | 80 |
| | Non-insulating filler | Content (wt %) | 10 | 40 | 20 | 10 | 10 |
| | Insulating filler | Content (wt %) | 90 | 60 | 80 | 90 | 90 |
| | | Average particle diameter (μm) | 150 | 150 | 150 | 150 | 150 |
| Graphite-polymer composite | Inclusion of metal core layer | | ○ | ○ | ○ | ○ | ○ |
| Property evaluation | In-plane thermal conductivity (W/m · K) | | 3.88 | 4.56 | 6.3 | 2.34 | 3.79 |
| | Tensile strength (kgf/cm$^2$) | | 713 | 711 | 713 | 715 | 714 |
| | Impact strength (Kgf · cm/cm) | | 4.0 | 4.0 | 4.0 | 4.1 | 4.0 |
| | Surface resistance (Ω/sq) | | $5.1 \times 10^{15}$ | $1.7 \times 10^4$ | $2.7 \times 10^{15}$ | $1.4 \times 10^{15}$ | $1.6 \times 10^{15}$ |
| | Volume resistance (Ω · cm) | | $2.8 \times 10^{15}$ | $2.0 \times 10^3$ | $5.7 \times 10^{14}$ | $4.0 \times 10^{14}$ | $4.1 \times 10^{14}$ |
| | Dielectric breakdown strength (kV/mm) | | 41.3 | Immeasurable | 36.9 | 40.6 | 41.2 |
| | Dielectric breakdown voltage (kV) | | 45.9 | Immeasurable | 38.1 | 43.8 | 45.8 |

TABLE 2

| | Classification | | Example 6 | Example 7 | Example 8 | Example 9 | Example 10 |
|---|---|---|---|---|---|---|---|
| Heat radiation filler | Total content (parts by weight) | | 200 | 260 | 100 | 100 | 100 |
| | Non-insulating filler | Content (wt %) | 10 | 10 | 10 | 10 | 10 |
| | Insulating filler | Content (wt %) | 90 | 90 | 90 | 90 | 90 |
| | | Average particle diameter (μm) | 150 | 150 | 5 nm | 10 | 500 |
| Graphite-polymer composite | Inclusion of metal core layer | | ○ | ○ | ○ | ○ | ○ |
| Property evaluation | In-plane thermal conductivity (W/m · K) | | 6.54 | 6.72 | 3.01 | 3.76 | 7.6 |
| | Tensile strength (kgf/cm$^2$) | | 702 | 538 | 711 | 713 | 706 |
| | Impact strength (Kgf · cm/cm) | | 3.9 | 2.9 | 4.0 | 4.0 | 3.8 |
| | Surface resistance (Ω/sq) | | $8.3 \times 10^{15}$ | $8.8 \times 10^{15}$ | $5.4 \times 10^{14}$ | $3.9 \times 10^{15}$ | $5.0 \times 10^{15}$ |
| | Volume resistance (Ω · cm) | | $6.0 \times 10^{15}$ | $6.4 \times 10^{15}$ | $1.0 \times 10^{14}$ | $8.6 \times 10^{14}$ | $2.7 \times 10^{15}$ |
| | Dielectric breakdown strength (kV/mm) | | 46.7 | 47.5 | 28.3 | 37.7 | 41.0 |
| | Dielectric breakdown voltage (kV) | | 51.6 | 52.0 | 30.9 | 39.0 | 45.6 |

TABLE 3

| Classification | | | Example 11 | Example 12 | Comparative Example 1 | Comparative Example 2 |
|---|---|---|---|---|---|---|
| Heat radiation filler | Total content (parts by weight) | | 100 | 100 | 100 | 100 |
| | Non-insulating filler | Content (wt %) | 10 | 10 | 100 | 0 |
| | Insulating filler | Content (wt %) | 90 | 90 | 0 | 100 |
| | | Average particle diameter (μm) | 700 | 150 | — | 150 |
| Graphite-polymer composite | Inclusion of metal core layer | | ○ | × | ○ | ○ |
| Property evaluation | In-plane thermal conductivity(W/m · K) | | 7.82 | 2.37 | 8.6 | 2.14 |
| | Tensile strength (kgf/cm$^2$) | | 552 | 623 | 710 | 712 |
| | Impact strength (Kgf · cm/cm) | | 3.0 | 3.2 | 4.0 | 4.0 |
| | Surface resistance (Ω/sq) | | $4.8 \times 10^{15}$ | $4.9 \times 10^{15}$ | $2.1 \times 10^2$ | $3.4 \times 10^{15}$ |
| | Volume resistance (Ω · cm) | | $2.5 \times 10^{15}$ | $2.7 \times 10^{15}$ | $5.3 \times 10$ | $7.6 \times 10^{15}$ |
| | Dielectric breakdown strength (kV/mm) | | 40.7 | 40.2 | Immeasurable | 43.5 |
| | Dielectric breakdown voltage (kV) | | 45.1 | 44.8 | Immeasurable | 49.3 |

As can be seen in Table 1 to Table 3, Example 1, 3, 5, 6, 9 and 10 in which all the conditions of the present invention such as the contents of the non-insulating filler and the insulating filler in the heat radiation filler of the present invention, the total content of the heat radiation filler, the average particle diameter of the insulating filler, the inclusion of metal core layer, and the like were satisfied exhibited excellent heat radiation performance, insulation performance and mechanical properties compared to Examples 2, 4, 7, 8, 11 and 12 and Comparative Examples 1 and 2 in which at least one of the conditions was not satisfied.

While one exemplary embodiment of the present invention has been described above, the spirit of the present invention is not limited to the embodiment presented herein. Those of ordinary skill in the art who understand the spirit of the present invention may be able to easily propose other embodiments by adding, changing, deleting, or supplementing elements within the scope of the present invention, and it should be understood that the proposed embodiments are also encompassed in the scope of the present invention.

The invention claimed is:

1. A composition for producing a graphite-polymer composite, the composition comprising:
    a heat radiation filler including a non-insulating filler and an insulating filler, wherein the non-insulating filler includes a graphite composite including nanoparticles bonded to a graphite surface and a catecholamine layer; and
    a matrix-forming component including a thermoplastic polymer compound,
    wherein the amount of the heat radiation filler is 70 to 230 parts by weight relative to 100 parts by weight of the matrix-forming component.

2. The composition of claim 1, wherein the amount of the insulating filler is 70 to 95% by weight of the total heat radiation filler.

3. The composition of claim 1, wherein the insulating filler includes one or more selected from the group consisting of magnesium oxide, titanium dioxide, aluminum nitride, silicon nitride, boron nitride, aluminum oxide, silica, zinc oxide, barium titanate, strontium titanate, beryllium oxide, manganese oxide, talc, silicon carbide, and silicon dioxide.

4. The composition of claim 1, wherein the average particle diameter of the insulating filler is in the range of 10 nm to 600 μm.

5. The composition of claim 1, wherein the catecholamine layer is provided on at least a surface of the nanoparticles.

6. The composition of claim 1, wherein the graphite composite further includes a polymer layer at least covering the catecholamine layer.

7. The composition of claim 1, wherein the average particle diameter of the graphite composite is in the range of 50 to 600 μm.

8. The composition of claim 1, wherein the thermoplastic polymer compound is a compound selected from the group consisting of polyamide, polyester, polyketone, a liquid crystal polymer, a polyolefin, polyphenylene sulfide (PPS), polyether ether ketone (PEEK), polyphenylene oxide (PPO), polyethersulfone (PES), polyetherimide (PEI), and polyimide, or a mixture or copolymer of two or more thereof.

9. A masterbatch for producing a graphite-polymer composite, the masterbatch prepared by molding the composition of claim 1.

10. A graphite-polymer composite comprising:
    a heat radiation filler including a non-insulating filler and an insulating filler, wherein the non-insulating filler includes a graphite composite including nanoparticles bonded to a graphite surface and a catecholamine layer; and
    a polymer matrix prepared by molding a thermoplastic polymer compound and including the heat radiation filler dispersed therein,
    wherein the amount of the heat radiation filler is 70 to 230 parts by weight relative to 100 parts by weight of the thermoplastic polymer compound.

11. The graphite-polymer composite of claim 10, wherein a protective coating layer is further provided on an outer surface of the polymer matrix.

12. The graphite-polymer composite of claim 10, wherein a metal core layer is further provided inside the polymer matrix.

13. The graphite-polymer composite of claim 12, wherein the metal core layer is one type of metal selected from the group consisting of aluminum, magnesium, iron, titanium, and copper, or an alloy containing at least one type of metal thereamong.

* * * * *